United States Patent
Tanaka

(10) Patent No.: US 7,876,571 B2
(45) Date of Patent: Jan. 25, 2011

(54) WIRING BOARD AND METHOD OF MANUFACTURING WIRING BOARD

(75) Inventor: Shinji Tanaka, Tokyo (JP)

(73) Assignee: NEC Corporation, Tokyo (JP)

( * ) Notice: Subject to any disclaimer, the term of this patent is extended or adjusted under 35 U.S.C. 154(b) by 522 days.

(21) Appl. No.: 11/857,894

(22) Filed: Sep. 19, 2007

(65) Prior Publication Data

US 2008/0066950 A1   Mar. 20, 2008

(30) Foreign Application Priority Data

Sep. 20, 2006   (JP) .............................. 2006-254292

(51) Int. Cl.
   *H05K 7/10*   (2006.01)
(52) U.S. Cl. ............... 361/767; 361/761; 361/760; 361/808; 361/811; 174/261; 174/262; 174/256
(58) Field of Classification Search ......... 174/260–266, 174/259, 250, 257, 255, 256, 557, 534; 361/760, 361/761, 763, 767, 778, 808, 81, 794, 757, 361/751, 739, 752, 771, 748, 807
See application file for complete search history.

(56) References Cited

U.S. PATENT DOCUMENTS

| | | | | |
|---|---|---|---|---|
| 6,229,404 | B1* | 5/2001 | Hatanaka | 331/68 |
| 6,324,067 | B1* | 11/2001 | Nishiyama | 361/761 |
| 6,627,864 | B1* | 9/2003 | Glenn et al. | 250/208.1 |
| 6,734,535 | B1* | 5/2004 | Hashimoto | 257/668 |
| 6,759,266 | B1* | 7/2004 | Hoffman | 438/64 |
| 2001/0042640 | A1* | 11/2001 | Nakamura et al. | 174/262 |
| 2003/0171011 | A1* | 9/2003 | Li | 439/68 |

FOREIGN PATENT DOCUMENTS

| JP | 10-22643 A | 1/1998 |
|---|---|---|
| JP | 2004-342641 A | 12/2004 |

\* cited by examiner

*Primary Examiner*—Dameon E Levi
*Assistant Examiner*—Hoa C Nguyen
(74) *Attorney, Agent, or Firm*—Sughrue Mion, PLLC

(57) ABSTRACT

A board comprises a cavity for placing an electronic component on a base, a pair of pads for mounting said electronic component, each of said pads is formed on said base, a pair of through holes piercing through said board from said base, each of said through holes includes a land, and wires which electrically connect said lands and said pads, respectively.

9 Claims, 8 Drawing Sheets

33 : NON-ELECTROLYTIC NICKEL PLATING
34 : NON-ELECTROLYTIC GOLD PLATING

33 : NON-ELECTROLYTIC NICKEL PLATING
34 : NON-ELECTROLYTIC GOLD PLATING

33 : NON-ELECTROLYTIC NICKEL PLATING
34 : NON-ELECTROLYTIC GOLD PLATING

WIRING BOARD AND METHOD OF MANUFACTURING WIRING BOARD

BACKGROUND OF THE INVENTION

A present invention relates to a wiring board and a method of manufacturing a wiring board, and relates in particular to the wiring board and the method of manufacturing the wiring board for improving the reliability of component connections.

A decoupling capacitor must usually be placed around the LSI in order to reduce the power supply noise that accompanies high-speed LSI operation. Recently typical wiring boards are even formed with a cavity containing a component (capacitor, etc.). On this type of wiring board, the cavity must be formed on the surface of the wiring board corresponding to the rear side of the LSI so that the distance between the LSI and capacitor must be kept as short as possible.

A technology characterized in that "the capacitor terminal electrode and the inner through hole within the cavity, or the exposed section of the through hole are connected" is disclosed in the Laid-Open Hei No. 2004-342641. In other words, the terminal electrode and inner through hole or through hole form a pair.

A cavity forming technique is disclosed for example in Laid-Open Hei No. 10-22643. This technology is capable of highly accurate control along the Z-axis by utilizing a numerically controlled machine tool to electrically detect contact between the machining drill and the wiring board. This technology is related technology capable forming a cavity on the wiring board of the present invention.

SUMMARY OF THE INVENTION

In the technology disclosed in the Laid-Open Hei No. 2004-342641, it is necessary that the position of the inner through hole or the through hole matches the position of the terminal electrode of the capacitor. An electrode dimension of the low ESL capacitor recently is substantially 0.3 mm pitch or 0.2 mm pitch. However, forming the through hole at 0.3 mm pitch or 0.2 mm pitch is extremely difficult and even supposing that forming the through hole at this narrow pitch is possible, the through hole itself must be made smaller. Making the through hole smaller reduces the area to be contacted with the electrode of the capacitor, and lowers the reliability of connections such as soldered connections.

In the technology disclosed in the Laid-Open Hei No. 2004-342641, the electrode of the capacitor is mounted on the land of the through hole. The size of the land is not enough for mounting the electrode of the capacitor. So, the reliability of the connection between the electrode and the land is decreased. It is a problem of the technology disclosed in the Laid-Open Hei No. 2004-342641.

The object of the present invention is to provide a wiring board and a method of manufacturing wiring board for resolving the above mentioned problem.

A board comprises a cavity for placing an electronic component on a base, a pair of pads for mounting said electronic component, each of said pads is formed on said base, a pair of through holes piercing through said board from said base, each of said through holes includes a land, and wires which electrically connect said lands and said pads, respectively.

A board comprises a cavity for placing an electronic component on a base, a pair of through holes piercing through said board from said base, a distance between said through holes fits within said cavity and is substantially minimum to make said through holes, a pair of pads for mounting said electronic component, a pitch of said electronic component is shorter than said distance, and wires which electrically connects lands of said through holes and said pads, respectively.

A method of manufacturing a board comprises forming a pair of through holes including land, a pair of pads for mounting a component, and wires for electrically connecting said pad and said land, in the inner layer of said board, forming a cavity for exposing said pad, coating said pad with a first plating of low solder wettability, coating said coated pad with a second plating of high solder wettability, and removing said second plating coating with said land and said wire.

A method of manufacturing a board comprises forming a pair of through holes including land, a pair of pads for mounting a component, and wires for electrically connecting said pad and said land, in the inner layer of said board, forming a first cavity for exposing said pad, coating said pad with a first plating of low solder wettability, coating said coated pad with a second plating of high solder wettability, and forming a second cavity for exposing said land and said wire.

BRIEF DESCRIPTION OF THE DRAWINGS

Other features and advantages of the invention will be made more apparent by the following detailed description and the accompanying drawings, wherein.

In the drawings, the same reference numerals represent the same structural elements.

DETAILED DESCRIPTION OF THE PREFERRED EMBODIMENTS

Figure 1A:
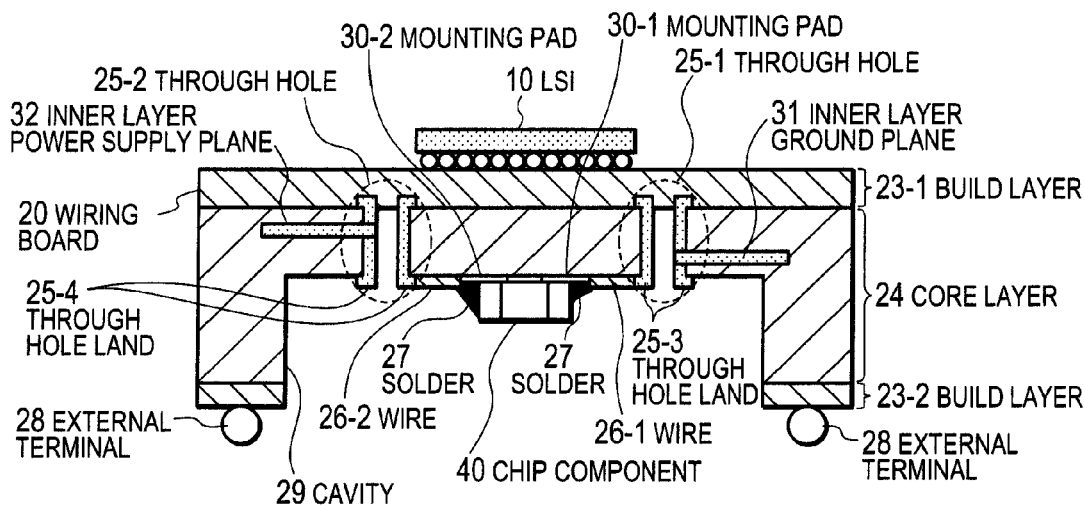
FIG. 1A is a drawing showing the wiring board of a first exemplary embodiment of the present invention.
Figure 1B:
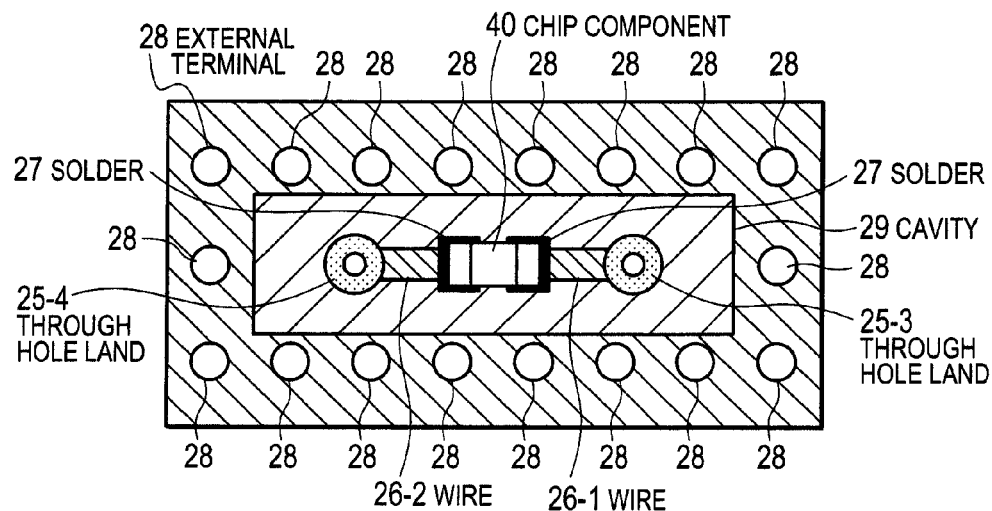
FIG. 1B is a drawing showing the wiring board of the first exemplary embodiment of the present invention.

A first exemplary embodiment of the present invention is described referring to the drawings. FIG. 1 is a structural view of the wiring board 20, a cavity 29 of the first exemplary embodiment is formed on the wiring board 20. FIG. 1A is a cross sectional view and FIG. 1B is a bottom view.

A wiring board 20 of the first exemplary embodiment as shown in FIG. 1 includes a core layer 24, a build layer 23-1, and a build layer 23-2. The core layer 24 includes an inner layer ground plane 31, and an inner layer power supply plane 32.

An LSI 10 is mounted on the upper surface (build layer 23-1) of the wiring board 20. An external terminal 28 is mounted on the bottom surface (build layer 23-2) of the wiring board 20. The cavity 29 is formed on the bottom side of the wiring board 20. A mounting pad 30-1 and a mounting pad 30-2 for mounting a chip component 40 are formed within the cavity 29. The chip component 40 is mounted on a base of the cavity 29. The chip component is a capacitor, for example.

The mounting pad 30-1 is connected to the inner layer ground plane 31 via a wire 26-1 (for example, the short wire 26-1 is made of copper) and a through hole 25-1. The mounting pad 30-2 is connected to the inner layer power supply plane 32 via a wire 26-2 (for example, the short wire 26-2 is made of copper) and a through hole 25-2. The wires 26-1, 26-2 is short, for example, the length of the wires 26-1, 26-2 is within the range from 0.1 mm to 0.5 mm. The distance between the through holes 25-1 and the through hole 25-2 is slightly longer than the pitch of the electrode of the chip component. When the chip component is the capacitor, the pitch of the electrode of the capacitor is within the range from 0.2 mm to 0.3 mm, for example. So, in the case, the distance between the through hole 25-1 and the through hole 25-2 is slightly longer than the pitch of the electrode by the range from 0.1 mm to 0.5 mm, for example. However, the distance between the through hole 25-1 and the through hole 25-2 is not limited above mentioned distance. It is preferable that the distance between the through hole 25-1 and the through hole 25-2 is minimum distance for forming the wires 26-1, 26-2 between the through holes 25-1, 25-2 and the electrodes of the chip component. In other words, the wires 26-1 and 26-2 are formed in a length required for connecting the electrode of the chip component 40 and the through hole lands formed at a pitch longer than the pitch of the electrode of the chip component 40. The length of the wires 26-1 and 26-2 is for example approximately 0.1 to 0.5 millimeters. However the length of the wires 26-1 and 26-2 is not limited to these dimensions. As shown in FIG. 1B, the wires 26-2 and 26-2, the mounting pads 30-1 and 30-2, and the through holes 25-3 and 25-4 are aligned in substantially linearly.

A distance between the through hole 25-3 and the through hole 25-4 fits within the cavity 29, and is substantially minimum to make the through holes 25-3, 25-4 in the size for remaining the high solderability.

The through hole 25-1 contains a through hole land 25-3 (for example, the through hole land 25-3 is made of copper). The through hole 25-2 contains a through hole land 25-4 (for example, the through hole land 25-4 is made of copper). The through hole land 25-3 and the through hole land 25-4 are separate from the mounting pad 30-1 and the mounting pad 30-2, respectively. And, The through hole 25-3, 25-4 are not directly connected to the mounting pad 30-1 and the mounting pad 30-2, respectively. In other words, the pitch of the through hole lands 25-3, 25-4 is longer than the pitch of the mounting pads 30-1, 30-2. The wire 26-1 connects the mounting pad 30-1 and the through hole land 25-3. The wire 26-2 connects the mounting pad 30-2 and the through hole land 25-4.

Surface treatment performed on the surface of the mounting pad 30-1 and the mounting pad 30-2 may include, "non-electrolytic nickel plating and non-electrolytic gold plating", "preflux coating (organic solderability preservatives)", or "solder precoating".

Here, the terms "non-electrolytic nickel plating and non-electrolytic gold plating" are described. The non-electrolytic nickel plating is utilized for the layer preventing cross-diffusion between copper and gold. The wiring board 20 is usually made of copper. The copper itself can be directly plated with gold, but immediately cross-diffuses when heat is applied. To prevent the cross-diffusion, non-electrolytic nickel plating is applied as an under-layer plating of good adhesiveness. Nickel tends to oxidize when exposed to air, and then, the solder wettability decreases.

Non-electrolytic gold plating has high solder wettability. And, non-electrolytic gold plating is used for making solder connections. Gold also has the advantages of being storable for long periods. And, gold has a heat-resistant compared to preflux (organic solderability preservatives).

It is possible to use other plating which has low solder wettability instead of non-electrolytic nickel plating. Also, it is possible to use other plating which has high solder wettability instead of non-electrolytic gold plating.

Next, a soldermask is described. First, a soldermask film is formed on the board surface, and then, a pattern is formed by photolithographic techniques. This is a soldermask. The soldermask cannot therefore form within the cavity 29. Because, soldermask is exposed to light by techniques such as contact photolithography so the interior of the cavity 29 cannot be exposed to light.

The mounting pad 30-1, the mounting pad 30-2, the wire 26-1, the wire 26-2, the through hole 25-1, and the through hole 25-2 are conductors exposed within the cavity 29, and are all applied to the surface treatment.

The solder 27 connects the chip component 40, the mounting pad 30-1, and the mounting pad 30-2.

In the first exemplary embodiment of the present invention, the mounting pad 30-1 (mounting pad 30-2) where the chip component 40 is mounted within the cavity 29, is not directly connected to the through hole land 25-3 (through hole land 25-4). The size of the mounting pad 30-1 (mounting pad 30-2) can therefore be enlarged since these two components are not directly connected, rendering the effect of improving the parts connection reliability.

This effect is obtained due to the existence of the wire 26-1 (wire 26-2) connecting the mounting pad 30-1 (mounting pad 30-2) and the through hole land 25-3 (through hole land 25-4).

Figure 2A:
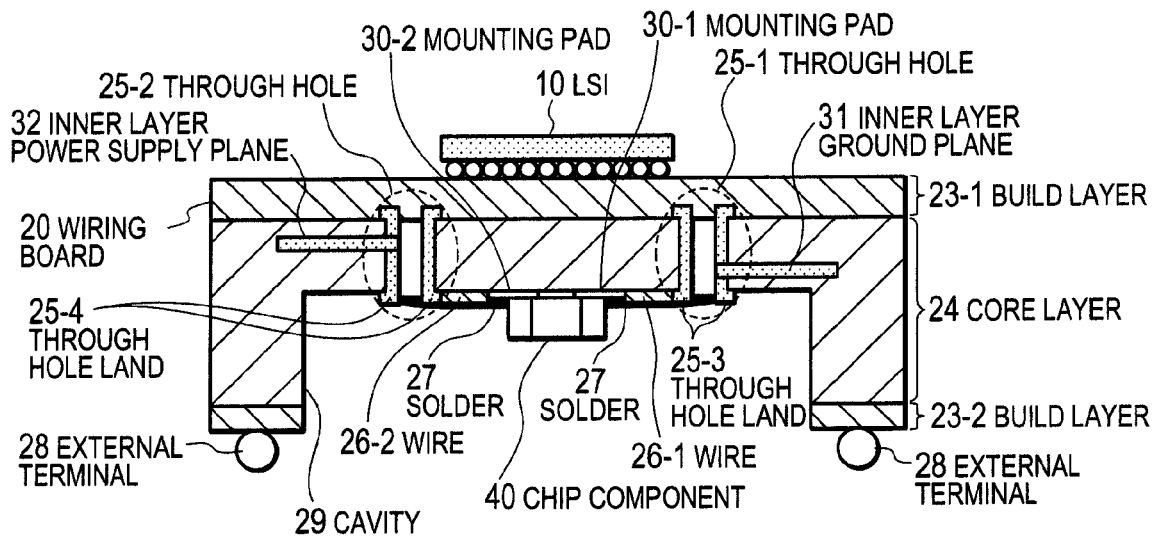
FIG. 2A is a drawing showing the solder wicking on the wiring board.
Figure 2B:
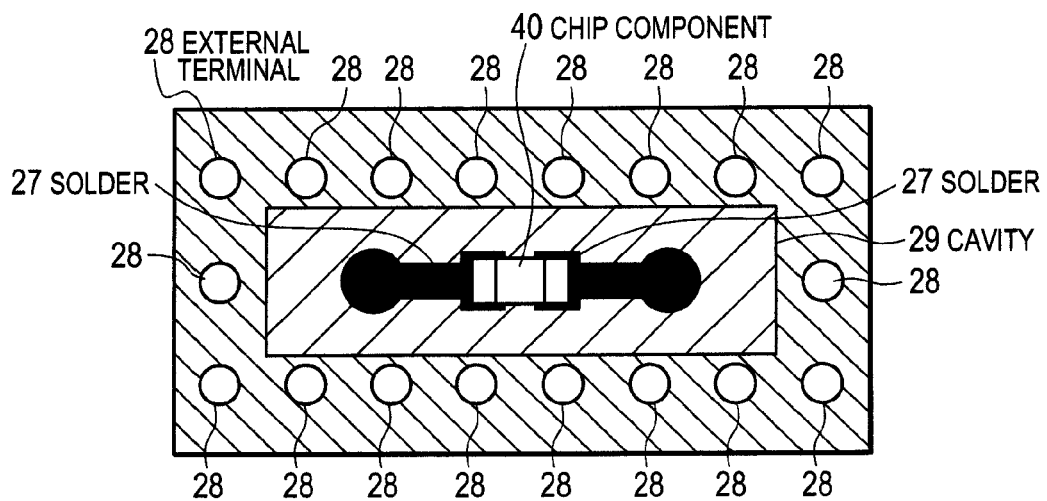
FIG. 2B is a drawing showing the solder wicking on the wiring board.

The second exemplary embodiment of the present invention is described next in detail while referring to the drawings. The second exemplary embodiment of the present invention is a method for manufacturing the wiring board 20 of the first exemplary embodiment of the present invention. FIG. 2 is a drawing for describing the solder wicking on the wiring board 20. In FIG. 2, the solder 27 supplied to the mounting pad 30-1 and mounting pad 30-2 wets the wire 26-1, the wire 26-2, the through hole 25-1, and the through hole 25-2 during reflow, and possibly cause solder wicking. The solder wicking occurs because the surface treatment applied to the wire 26-1 the wire 26-2, the through hole 25-1, and the through hole 25-2 which ought not to be wet.

The second exemplary embodiment of the present invention is described in detail while referring to the drawings. FIG. 3 is a drawing showing the cavity 35-1 and the cavity 35-2 of the wiring board 20 of the second exemplary embodiment of the present invention. FIG. 4 is a flowchart for showing the method for forming the cavity 35-1, 35-2 of the second exemplary embodiment of the present invention.

Figure 3A:
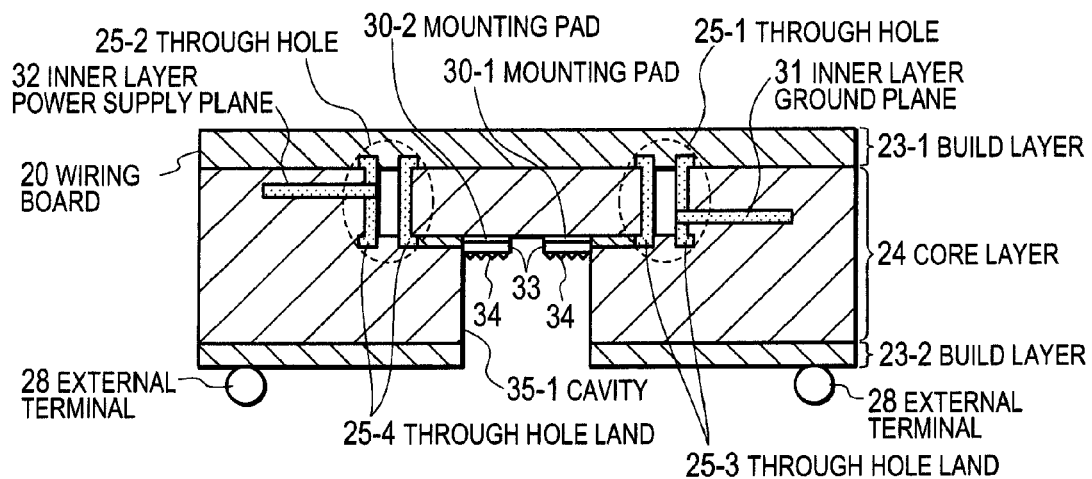
FIG. 3A is a drawing for describing the method for forming the cavity of the wiring board of a second exemplary embodiment of the present invention.
Figure 4:
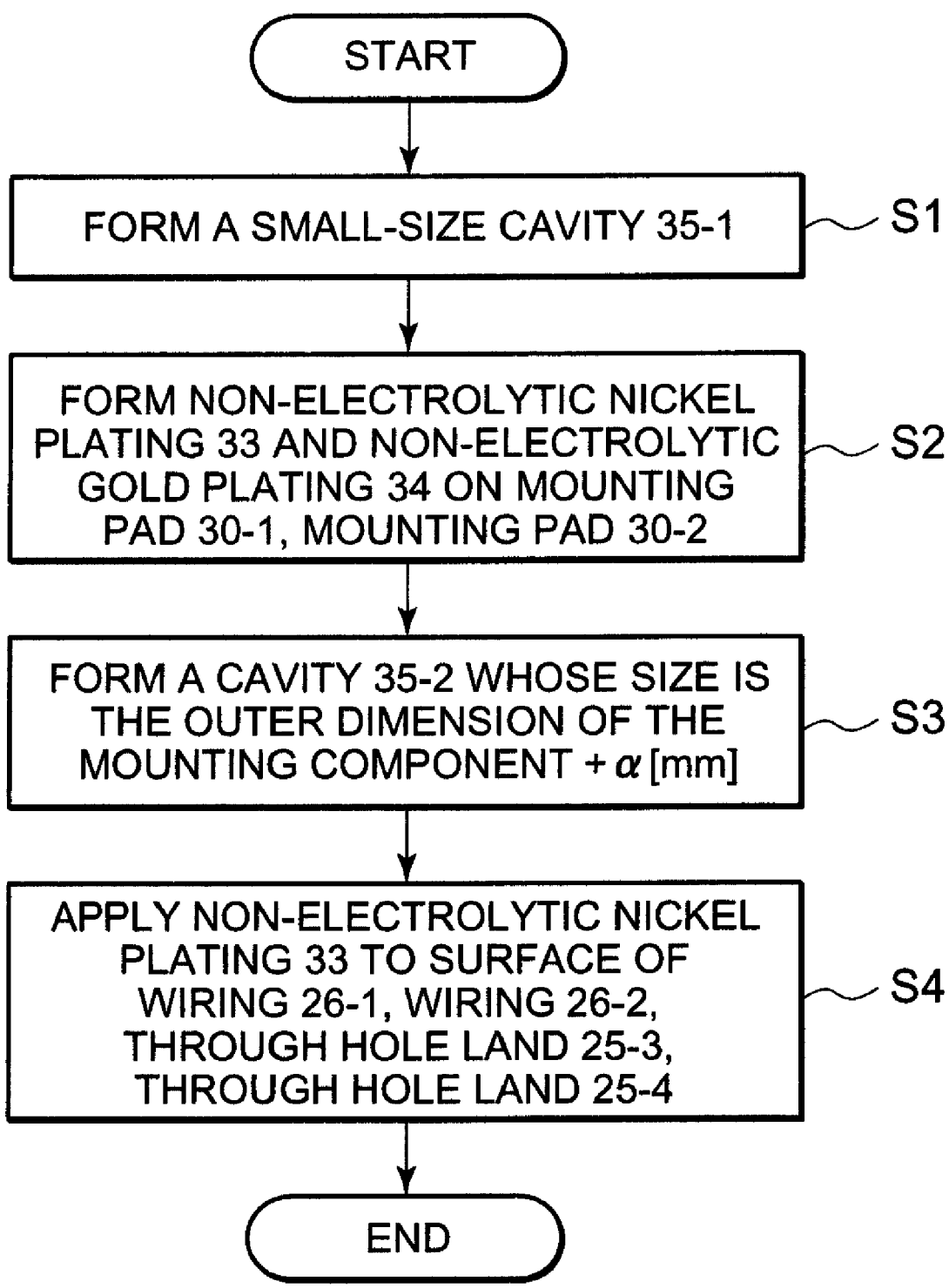
FIG. 4 is a flowchart for showing the manufacturing method of the second exemplary embodiment of the present invention.

A small cavity 35-1 is formed so that the mounting pad 30-1, the mounting pad 30-2 are exposed, and the wire 26-1, the wire 26-2, the through hole land 25-3, and the through hole land 25-4 are not exposed (FIG. 3A, and step S1 in FIG. 4). A non-electrolytic nickel plating 33 and a non-electrolytic gold plating 34 are formed on the surface of the mounting pad 30-1 and the mounting pad 30-2 (step S2). Mounting a component in the cavity 35-1 is difficult at this time.

Figure 3B:
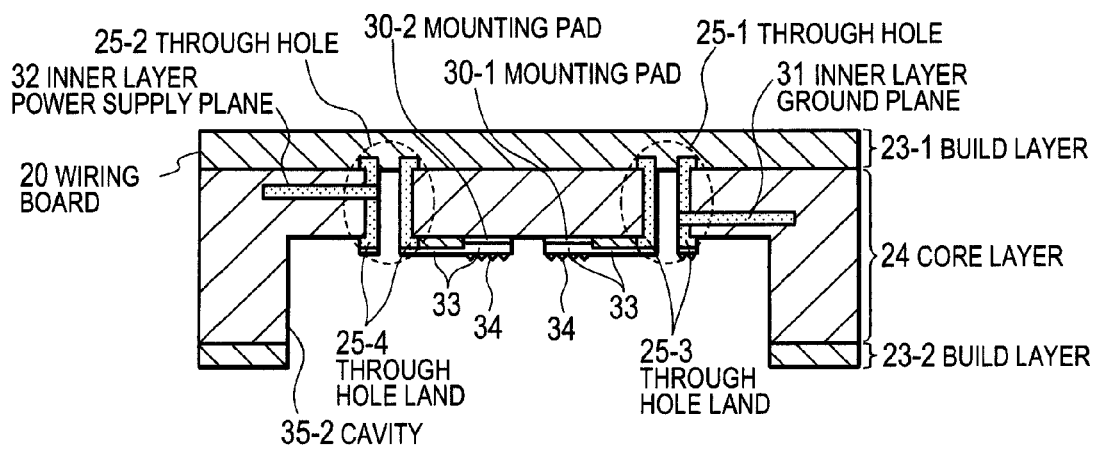
FIG. 3B is a drawing for describing the method for forming the cavity of the wiring board of the second exemplary embodiment of the present invention.

The cavity 35-2 whose size is the outer dimension of the mounting component (the chip component 40)+α[mm] (for example α=3, but is not limited to 3) is formed so that the wire 26-1, the wire 26-2, the through hole land 25-3, and the through hole land 25-4 are exposed (FIG. 3B, step S3 of FIG. 4).

The non-electrolytic nickel plating 33 is applied to the surface of the newly exposed wire 26-1, the wire 26-2, the through hole land 25-3, and the through hole land 25-4 (step S4). There is no need to apply non-electrolytic nickel plating to the surfaces of the mounting pad 30-1 and mounting pad 30-2 where the non-electrolytic nickel plating 33 and non-electrolytic gold plating 34 were already applied.

The non-electrolytic gold plating 34 need not be applied to the surfaces of the newly exposed wire 26-1, the wire 26-2, the through hole land 25-3, and the through hole land 25-4 at this point.

The second exemplary embodiment of the present invention renders the effect of preventing solder wicking. Solder wicking is prevented because the cavity 35-1 formed at first, and then the cavity 35-2 formed so that that surface treatment is selective and only the conductive piece (pads) are soldered.

Figure 5A:
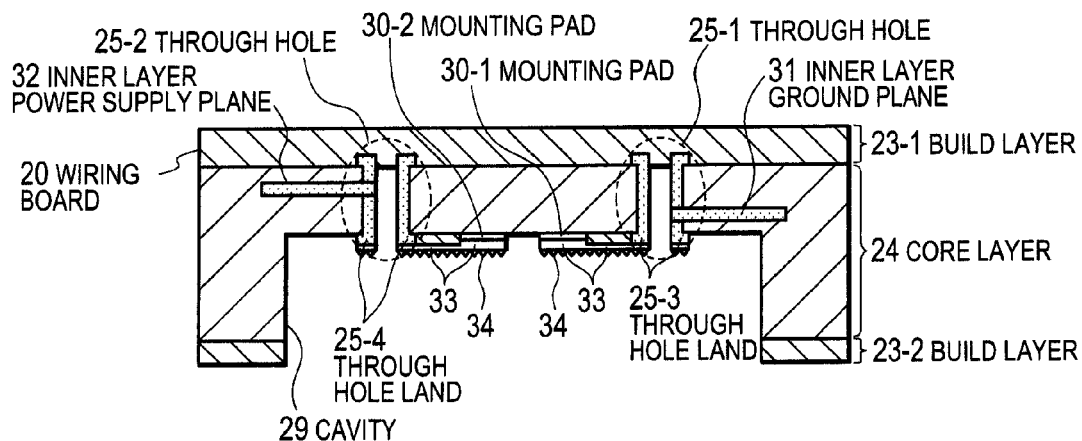
FIG. 5A is a drawing showing a third exemplary embodiment of the present invention.
Figure 5B:
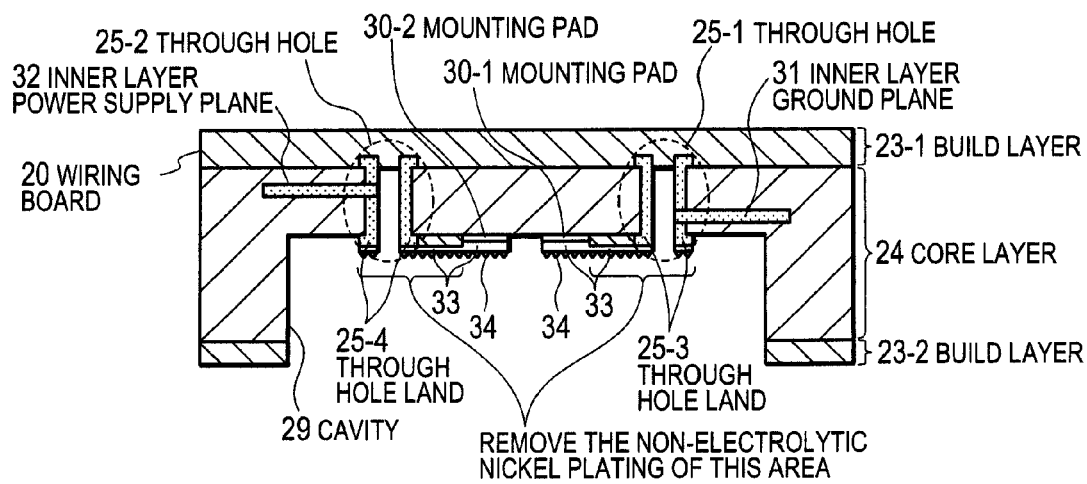
FIG. 5B is a drawing showing the third exemplary embodiment of the present invention.
Figure 6:
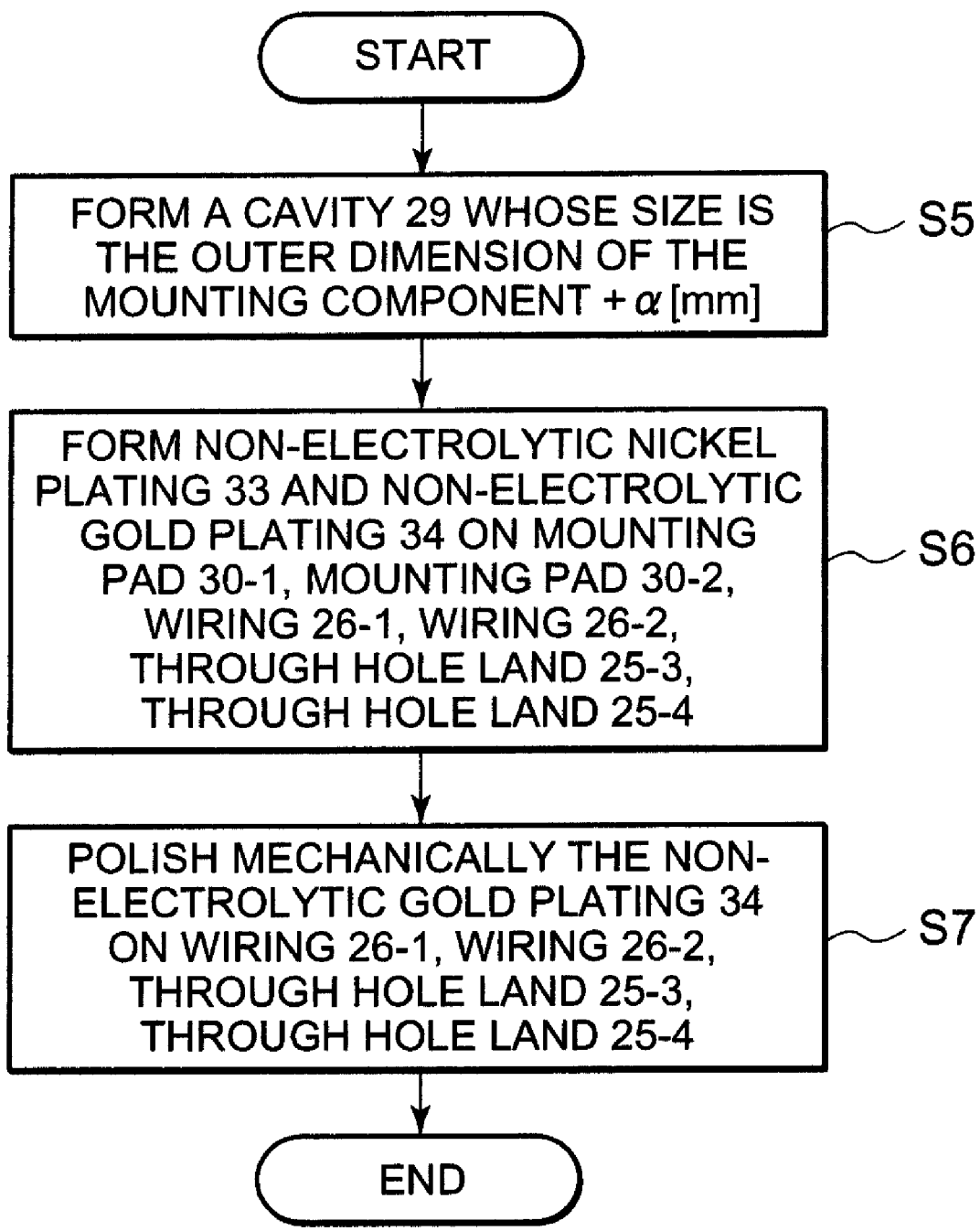
FIG. 6 is a flow chart for describing the manufacturing method for the third exemplary embodiment of the present invention.

A third exemplary embodiment of the present invention is described in detail next while referring to the drawings. FIGS. 5A and 5B is a drawing for describing the third exemplary embodiment of the present invention. FIG. 6 is a flow chart for describing the manufacturing method for the third exemplary embodiment of the present invention.

As shown in FIG. 5A, 5B and FIG. 6, the cavity 29 whose size is the outer dimension of the mounting component (chip component 40)+α[mm] is formed so that the mounting pad 30-1, the mounting pad 30-2, the wire 26-1, the wire 26-2, the through hole land 25-3, and the through hole land 25-4 are exposed (step S5 in FIG. 6). The non-electrolytic nickel plating 33 and the non-electrolytic gold plating 34 are applied to the mounting pad 30-1, the mounting pad 30-2, the wire 26-1, the wire 26-2, the through hole land 25-3, and the through hole land 25-4 (FIG. 5A, step S6 in FIG. 6). The non-electrolytic gold plating 34 on the wire 26-1, the wire 26-2, the through hole land 25-3, and the through hole land 25-4 is mechanically polished and cut to expose the non-electrolytic nickel plating 33 (FIG. 5B, step S7 in FIG. 6).

The third exemplary embodiment of the present invention renders the effect of preventing solder wicking during mounting of the chip component 40. The solder wicking is prevented because the non-electrolytic gold plating 34 is wetted by the solder 27 but the nickel surface of the non-electrolytic nickel plating 33 is oxidized and so is not easily wetted by the solder 27.

Figure 7:
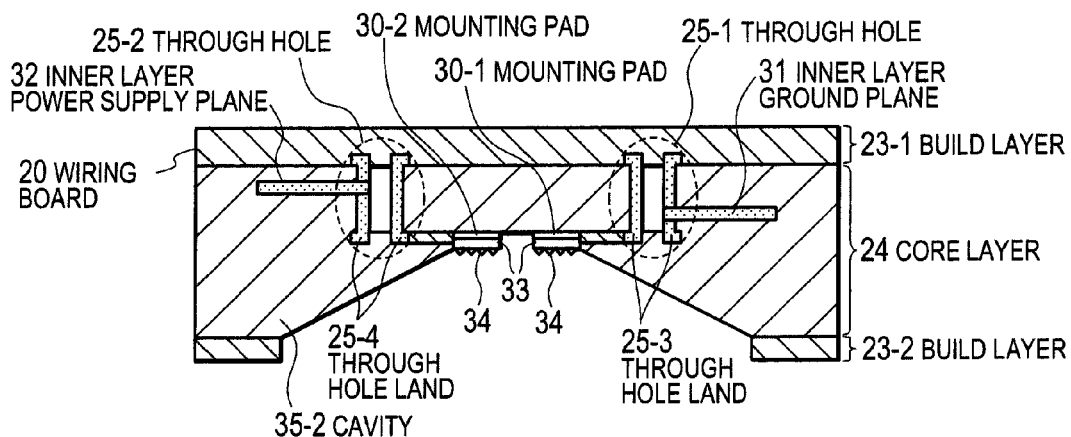
FIG. 7 is a drawing showing the wiring board of a fourth exemplary embodiment of the present invention.

A fourth exemplary embodiment of the present invention is described in detail while referring to the drawings. FIG. 7 is a drawing showing the wiring board 20 of the fourth exemplary embodiment of the present invention. The fourth exemplary embodiment of the present invention is a wiring board and a method for manufacturing that board.

As shown in FIG. 7, the cavity 29 is formed in a tapered shape so that the mounting pad 30-1 and the mounting pad 30-2 are exposed but the wire 26-1, the wire 26-2, the through hole land 25-3, and the through hole land 25-4 are not exposed.

The non-electrolytic nickel plating 33 and the non-electrolytic gold plating 34 are formed on the surface of the mounting pad 30-1 and the mounting pad 30-2.

The fourth exemplary embodiment of the present invention renders the effect of resolving irregularities in the mounting position and irregularities in the outer dimension of the chip component 40. These irregularities can be resolved on account of the tapered shape of the cavity 29.

Figure 8:
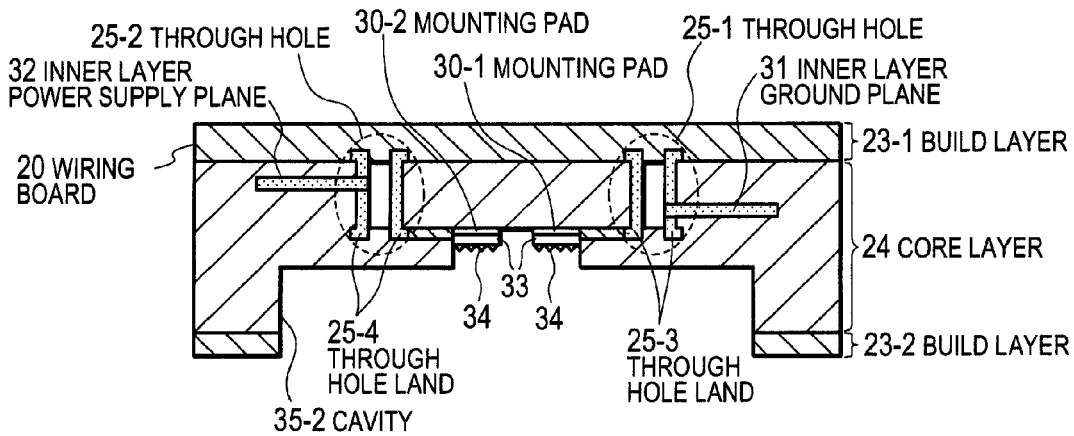
FIG. 8 is a drawing showing the wiring board of a fifth exemplary embodiment of the present invention.

A fifth exemplary embodiment of the present invention is described in detail while referring to the drawings. FIG. 8 is a drawing showing the wiring board 20 of the fifth exemplary embodiment of the present invention. The fifth exemplary embodiment of the present invention is a wiring board and a method for manufacturing that board.

As shown in FIG. 8, the cavity 29 is formed in a step shape so that the mounting pad 30-1 and the mounting pad 30-2 are exposed but the wire 26-1, the wire 26-2, the through hole land 25-3, and the through hole land 25-4 are not exposed.

The non-electrolytic nickel plating 33 and the non-electrolytic gold plating 34 are formed on the surface of the mounting pad 30-1 and the mounting pad 30-2.

The fifth exemplary embodiment of the present invention renders the effect of resolving irregularities in the mounting position and irregularities in the outer dimension of the chip component 40 and the effect is greater than that of the fourth exemplary embodiment. These irregularities can be resolved on account of the step shape of the cavity 29.

Figure 9:
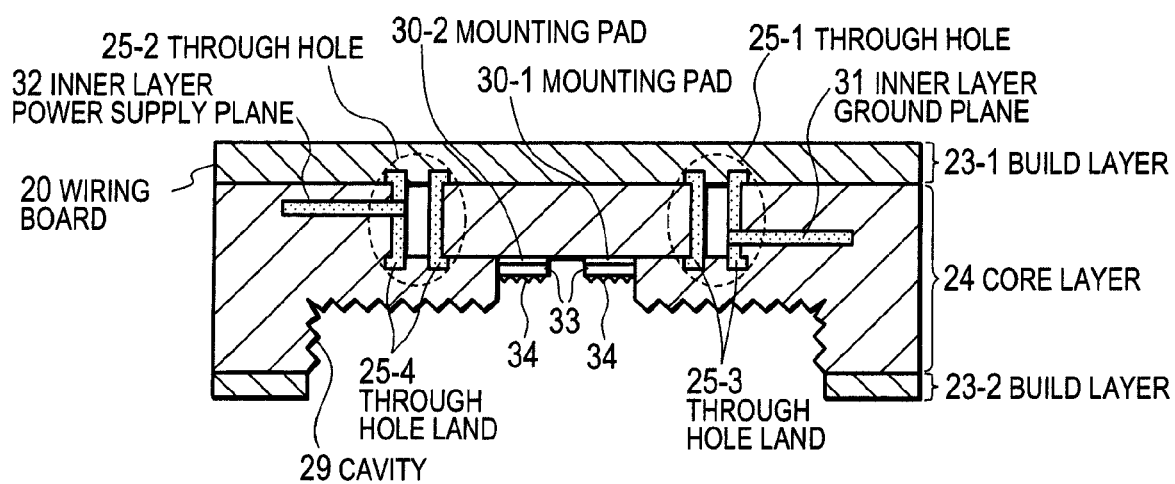
FIG. 9 is a drawing showing the wiring board of a sixth exemplary embodiment of the present invention.

A sixth exemplary embodiment of the present invention is described in detail while referring to the drawings. FIG. 9 is a drawing showing the wiring board 20 of the sixth exemplary embodiment of the present invention. The sixth exemplary embodiment of the present invention is a wiring board and a method for manufacturing that board.

As shown in FIG. 9, a projection is formed on the surface of the cavity 29 so that the mounting pad 30-1 and the mounting pad 30-2 are exposed but the wire 26-1, the wire 26-2, the through hole land 25-3, and the through hole land 25-4 are not exposed.

The non-electrolytic nickel plating 33 and the non-electrolytic gold plating 34 are formed on the surface of the mounting pad 30-1 and the mounting pad 30-2. The projection can also be applied to the first through the fifth exemplary embodiments. The sixth exemplary embodiment of the present invention renders the effect of dissipating heat. The reason for the heat dissipating effect is the projection.

Numerical controlled machine tools as described in the Laid-Open Hei No. 10-22643 can be utilized for the actual forming of the cavity 29, 35-1 and 35-2 in the first through the sixth exemplary embodiments.

This invention renders the effect of improving the reliability of connections. The connection reliability is improved because the existence of the wire connecting the through hole land to the mounting pads in the cavity on the wiring board.

A first wiring board of this invention includes separate mounting pads for mounting the components and the through hole lands of the through holes in the cavity, and also wiring connecting the through hole land and mounting pad.

A second wiring board of this invention according to the first wiring board includes a through hole land of the through hole for connecting to an inner layer ground plane and, a through hole land for a through hole connecting to an inner layer power supply plane.

A third wiring board of this invention according to the first or the second wiring board includes mounting pads subjected to non-electrolytic nickel plating and non-electrolytic gold plating.

A fourth wiring board of this invention according to any of the first through third wiring boards includes a through hole land subjected to non-electrolytic nickel plating and non-electrolytic gold plating.

A fifth wiring board of this invention according to any of the first through fourth wiring boards containing components connected by solder and mounting pads.

A sixth wiring board of this invention according to any of the first, second, third or fifth wiring boards where the mounting pads are exposed, and containing tapered cavities where the wiring and through hole lands are not exposed.

A seventh wiring board of this invention according to any of the first, second, third or fifth wiring boards where the mounting pads are exposed, and containing step-shaped cavities where the wiring and through hole lands are not exposed.

An eighth wiring board of this invention according to any of the first, second, third, sixth or seventh wiring boards where the cavities contains protrusions.

A first wiring board manufacturing method of this invention contains separate mounting pads for mounting the components and the through hole lands of the through holes in the cavity, and wiring for connecting the through hole lands to the mounting pads; and includes: a first process for forming cavities where the mounting pads are exposed, and the wiring and through hole lands are not exposed and; a second process for performing non-electrolytic gold plating and; a third process for forming cavities where the wiring and through hole lands are exposed.

A second wiring board manufacturing method of this invention according to the first wiring board manufacturing method, includes a fourth process for performing non-electrolytic nickel plating on the wiring and the through hole lands.

A third wiring board manufacturing method of this invention contains separate mounting pads for mounting the components and the through hole lands of the through holes in the cavity, and wiring for connecting the through hole lands to the mounting pads; and including: a first process for forming cavities where the mounting pads, the wiring, and through hole lands are exposed and; a second process for forming a non-electrolytic nickel plating 33 and a non-electrolytic gold plating on the mounting pads, the wiring, and the through hole lands; and a third process for cutting the non-electrolytic gold plating on the through hole lands and the wiring, and exposing the non-electrolytic nickel plating.

A fourth wiring board manufacturing method of this invention contains separate mounting pads for mounting the components and the through hole lands of the through holes in the cavity, and wiring for connecting the through hole lands to the mounting pads; and including: a process for forming a tapered cavity where the mounting pads are exposed but the wiring and through hole lands are not exposed.

A fifth wiring board manufacturing method of this invention contains separate mounting pads for mounting the components and the through hole lands of the through holes in the cavity, and wiring for connecting the through hole lands to the mounting pads; and a process for forming a stepped cavity where the mounting pads are exposed but the wiring and through hole lands are not exposed.

While this invention has been described in conjunction with the preferred embodiments described above, the invention can also be implemented in various forms and adaptations by those skilled in the art.

What is claimed is:

1. A board, comprising:
    a cavity for placing an electronic component on a base;
    a pair of pads for mounting said electronic component, each of said pads is formed on said base;
    a pair of through holes piercing through said board from said base, each of said through holes includes a land; and
    wires which electrically connect said lands and said pads, respectively;
    wherein said pads, wires, and lands are coated with a first material composed exclusively of low solder wettability material; wherein said first material on said pads is coated with a second material composed of high solder wettability material and said first material on said wires and on said lands is not coated with said second material.

2. The board according to claim 1, wherein said first material is a non-electrolytic nickel plating; and
    wherein said second material is a non-electrolytic gold plating.

3. The board according to claim 1, wherein said pair of through holes comprises:
    a first through hole including a first land, said first through hole is connected to a power supply layer formed at an inner layer of said board; and
    a second through hole including a second land, said second through hole is connected to a ground layer formed at an inner layer of said board.

4. The board according to claim 1, wherein said cavity further comprises:
    a first hole for exposing said land; and
    a second hole open wider than said first hole.

5. The board according to claim 4, wherein said first hole and said second hole are formed in a stepped shape each other.

6. The board according to claim 1, wherein said cavity is formed in a tapered shape.

7. The board according to claim 1, wherein a plurality of projections are formed on a surface of said cavity.

8. A board, comprising:
    a cavity for placing an electronic component comprising electrodes on a base;
    a pair of through holes piercing through said board from said base, a distance between said through holes fits within said cavity and is substantially minimum to make said through holes;
    a pair of pads for mounting said electronic component, a pitch of the electrodes of said electronic component is shorter than said distance; and
    wires which electrically connect lands of said through holes and said pads, respectively;
    wherein said pads, wires, and lands are coated with a first material composed exclusively of low solder wettability material; wherein said first material on said pads is coated with a second material composed of high solder wettability material and said first material on said wires and on said lands is not coated with said second material.

9. The board according to claim 8, wherein said through holes, said pads and said wires are aligned in substantially linearly.

* * * * *